United States Patent
Monschau et al.

(10) Patent No.: US 6,510,213 B1
(45) Date of Patent: Jan. 21, 2003

(54) UNIT FOR THE BIDIRECTIONAL DETECTION AND TRANSMISSION OF DATA VIA MODERN COMMUNICATION NETWORKS

(75) Inventors: Herrn Werner Monschau, Euskirchen (DE); Herrn Ottmar Lorenz, Lorsch (DE); Arrigo Schnabel, Hofheim (DE)

(73) Assignee: PSG Fertigungs- und Prozessautomations GmbH (DE)

( * ) Notice: Subject to any disclaimer, the term of this patent is extended or adjusted under 35 U.S.C. 154(b) by 0 days.

(21) Appl. No.: 09/623,552

(22) PCT Filed: Jan. 26, 1999

(86) PCT No.: PCT/EP99/00474

§ 371 (c)(1),
(2), (4) Date: Nov. 13, 2000

(87) PCT Pub. No.: WO99/46564

PCT Pub. Date: Sep. 16, 1999

(30) Foreign Application Priority Data

Mar. 11, 1998 (DE) .......................................... 198 10 335

(51) Int. Cl.[7] ............................................ H04M 11/00
(52) U.S. Cl. ............................. 379/106.03; 340/870.02
(58) Field of Search ....................... 379/106.01, 106.03, 379/92.01, 93.01, 93.05, 102.01; 340/870.01–870.03

(56) References Cited

U.S. PATENT DOCUMENTS 4,940,976 A    7/1990  Gastouniotis et al.
5,852,658 A  * 12/1998  Knight et al. .......... 379/106.03

FOREIGN PATENT DOCUMENTS

DE   43 21 037 A1   2/1995
DE  195 27 702 A1   1/1997
GB    2 297 663 A   2/1995

* cited by examiner

Primary Examiner—Wing Chan
(74) Attorney, Agent, or Firm—Connolly Bove Lodge & Hutz LLP

(57) ABSTRACT

The invention relates to an apparatus (1) for the automatic recording and two-way transmission of data, having a first interface (2) for the translation unit (4) for processing the data, the first interface (2) being a system which has bus capability and to which one or more terminals (5) can be connected, and the second interface (3) being an interface for the ISDN telephone network (6), for the cable television network or for satellite transmission.

4 Claims, 2 Drawing Sheets

UNIT FOR THE BIDIRECTIONAL DETECTION AND TRANSMISSION OF DATA VIA MODERN COMMUNICATION NETWORKS

The invention relates to an electronic appliance in accordance with the preamble to claim 1, namely an apparatus for the automatic recording and two-way transmission of data, having a first interface for the data input, a second interface for the data output and a translation unit for processing the data, also called a reading unit below.

Terminals found in private households and in small businesses, such as gas, water and electricity meters, are generally read once a year by the relevant energy supplier. The energy supplier needs to have the data read manually by an employee or the end consumer. This data is then transferred, predominantly manually, to a computer, which holds many sources of error. In the computer, the data forms the basis of accounting. Once the data has been recorded, the consumer has only a limited possibility of checking his specific consumption for peak load or creeping load, or of comparing the data with values from the past. Furthermore, it is virtually impossible for the energy supply companies (EVUs) to intervene in the present notion of energy supply, e.g. in terms of load management or added-value services.

Terminals with an interface for the data output on a bus basis are currently already used on an industrial scale, e.g. in large companies. After conversion, the terminal signals are forwarded to a serial interface (V24). The line connection between the serial interface and the recording computer is connected as a leased line with a dedicated telephone number, and is thus associated with high costs.

The invention is therefore based on the object of creating a simple and economical appliance which is able to manage various interfaces and protocols and thus allows variable, up-to-date and automatic reading of data, as well as control interventions (e.g. load control, added-value services from the EVU).

The invention achieves this object by means of an apparatus of the type mentioned in the introduction,
  wherein the first interface is a system which has bus capability and to which one or more terminals can be connected,
  wherein the second interface is an interface for the ISDN telephone network or for the cable television network or for satellite transmission, and
  wherein the translation unit consists of one or more programmable processors which are connected and programmed such that the conversion unit is able to detect a data request via the second interface and is able to send a data inquiry to the system having bus capability in order to forward it to the or to each terminal, and is able to read a data response from the or from each terminal via the system having bus capability, to process it and to forward it to the second interface.

The subject matter of the invention is therefore the apparatus according to claim 1. Preferred refinements are disclosed in the dependent claims. Individual or a plurality of these refinements, in each case alone or in combination, may also represent solutions to the problem on which the invention is based, and the features disclosed may also be combined in any desired manner.

The invention affords the following advantages: as a result of all the relevant data being read automatically, realized by means of an ISDN link, manual in-situ reading by an employee of the energy supplier or by the end consumer is eliminated. In addition, the consumer has the option of using a computer to examine his consumption data at any time, and of comparing this consumption data with values from the past, for example. The reading unit is additionally distinguished in that a dedicated telephone line (telephone number) is not required for reading the data; an already existing ISDN access facility can be jointly used instead. The apparatus according to the invention may advantageously be used for transmitting the data over modern communication networks, particularly over the cable television network or for satellite transmission. For access to the cable television network and for satellite transmission, a suitable second interface is, by way of example, a so-called set-top box, such as described in "Multimedia-Datenbanksysteme [Multimedia Database Systems]" (http://wwwipd.ira.uka.de/~oosem/MM98/Schneider/folge.html#1).

The new arrangement makes it possible to read counter readings in an up-to-date and economical fashion over an ISDN network, without connecting a dedicated telephone number (leased line).

The reading unit is able to record, convert and forward various data (gas, water, electricity consumption) flexibly, automatically and in an up-to-date fashion. The use of the existing infrastructure assures a low level of wiring, easy accessibility and a high availability level.

This type of two-way communication makes entirely new perspectives possible in energy and process planning, both for the end consumer and for the EVU (rapid and transparent processing, remote maintenance, monitoring and leak location, load-dependent and time-dependent accounting methods, load control, time-based determination of consumption on the free energy market, etc.).

The apparatus according to the invention will be described in more detail below with the aid of the illustrative embodiments shown in FIGS. 1 and 2. This is not in any way intended to be a restriction of the invention.

Figure 1:
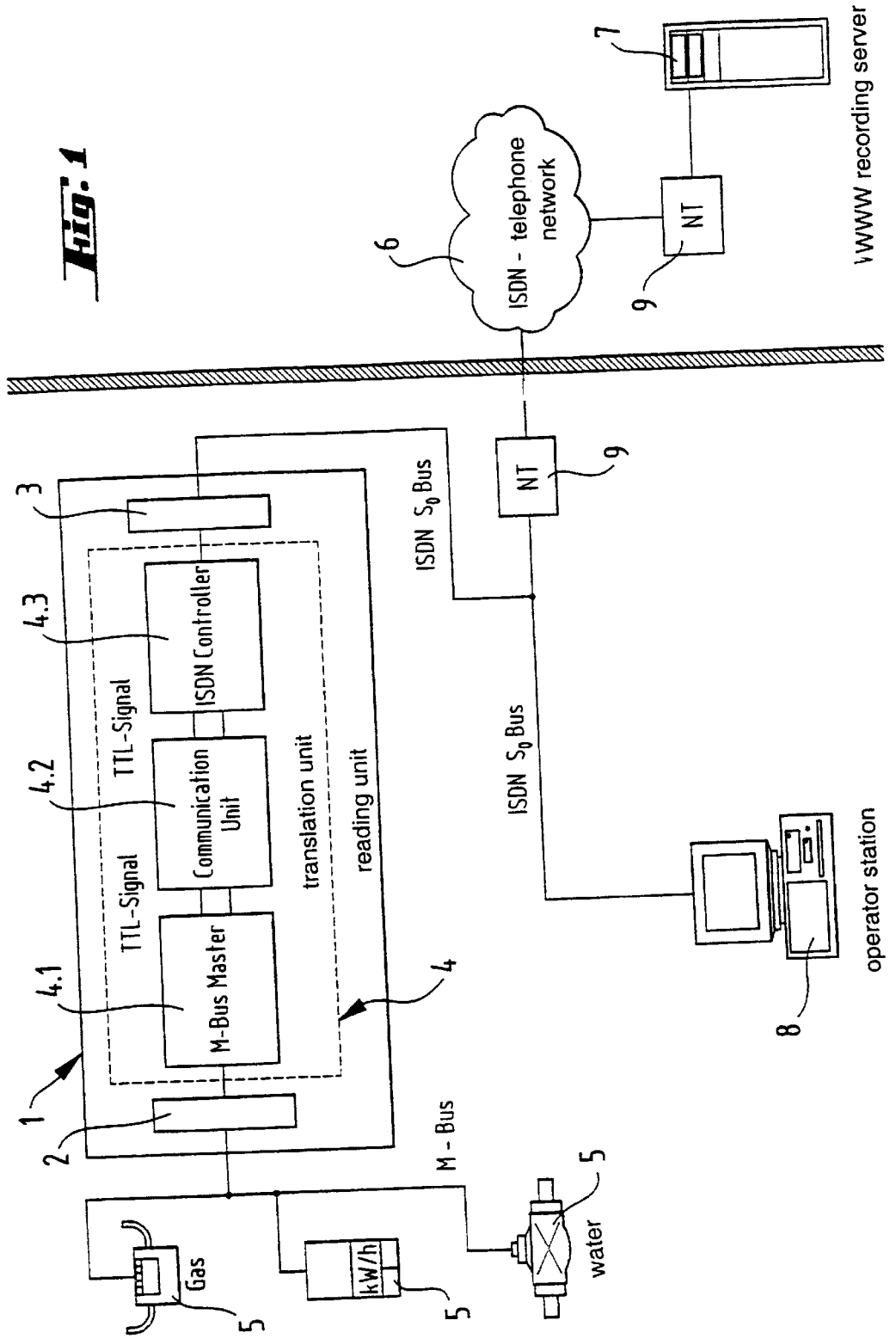
FIG. 1 shows a schematic overview of the invention.
Figure 2:
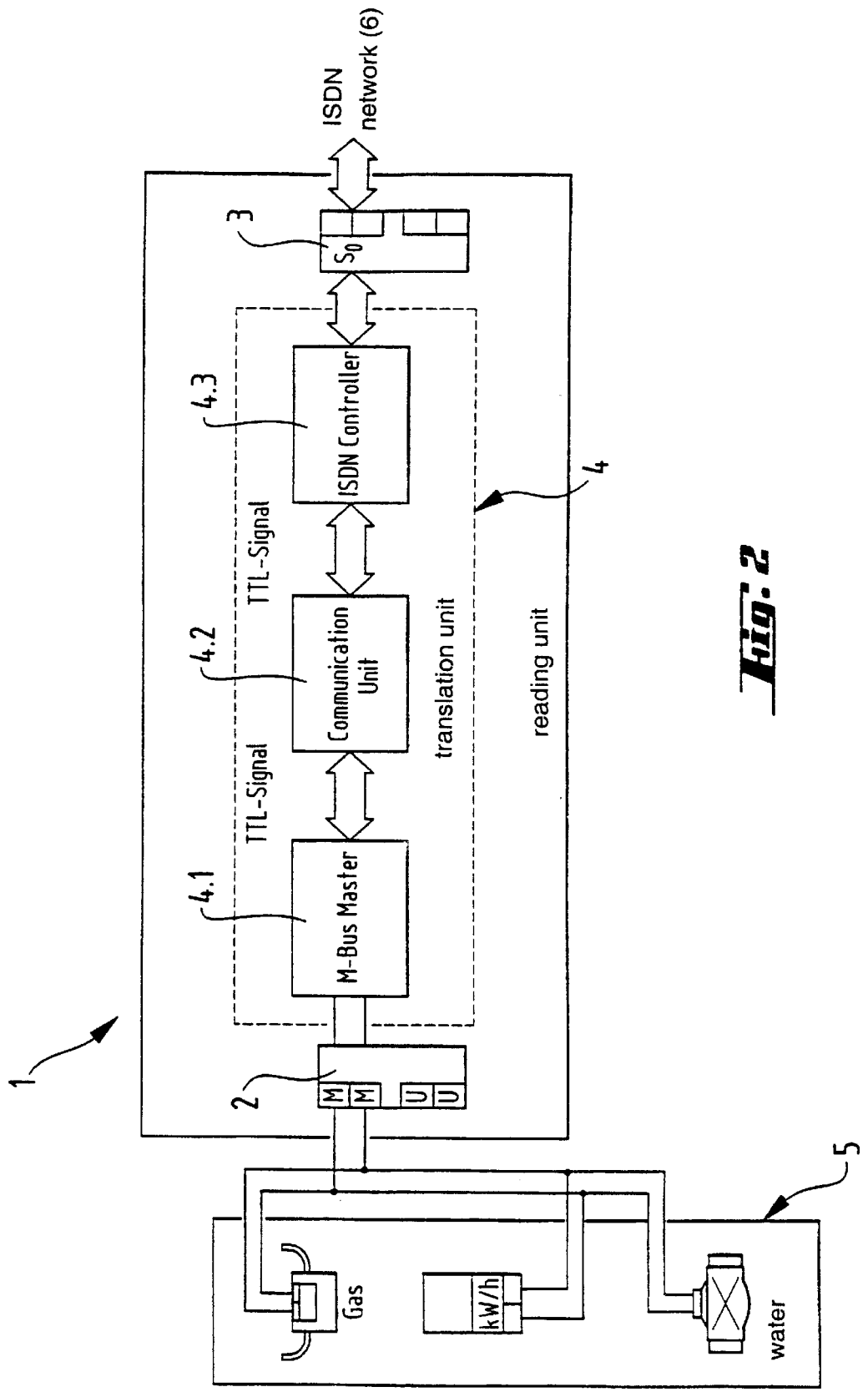
FIG. 2 shows an illustrative detail and function sketch.

The invention comprises a reading unit 1 for up-to-date, automatic recording and transmission of data, suitable for private end customers, local and medium-sized businesses. The reading unit 1 is part of a whole system, comprising the terminals 5, the reading unit 1, the ISDN telephone network 6, the recording computer 7, the visualization stations 8 and the network adapters 9.

The reading unit 1 is connected to the existing infrastructure on the consumer's premises (the consumer may be an energy consumer). The infrastructure may comprise various terminals 5, which may specifically be the gas, water and/or electricity meter, and the ISDN telephone network. To this end, the energy consumers (e.g. households) can be equipped with gas, water and/or electricity meters having an integrated bus (e.g. M or LON bus) or pulse outputs. The terminals 5 are connected by means of a bus line to the input interface 2 of the reading unit 1. At the output, the reading unit 1 is connected to the ISDN network 6 by means of a standard line via the interface 3. To process and convert the incoming signals, a translation unit 4 is provided which is connected to the input interface 2 and to the output interface 3. The translation unit 4 has the tasks of signal level conversion, two-way conversion of various protocol types (possibly M bus to $S_0$ bus), and interpretation of the protocols arriving in the two directions, with the aim of filtering out and forwarding the information intended for the reading unit 1. These tasks may be performed by a programmable processor or a plurality of coupled processors 4.1, 4.2, 4.3.

These may be split into the bus master 4.1, produced using a Zilog module, the communication unit 4.2, produced using a Z84C90 module, and an ISDN controller 4.3, produced using a Mitel Dil28 module.

Various terminals 5 may be connected to the input interface 2 of the reading unit 1 in parallel at the same time by means of a bus line (or by means of a two-wire line). The data can be read automatically and in an up-to-date fashion using the ISDN access facility and can be archived on a central computer 7. The data can be visualized over the telephone network 6. To this end, the computer 7 can be connected to the world wide web (WWW). The end consumer can then use a standard browser (possibly Netscape, for example) to receive his data in conditioned form. Access is gained using special access authorization.

What is claimed is:

1. An apparatus (1) for the automatic recording and two-way transmission of data, having a first interface (2) for the data input, a second interface (3) for the data output and a translation unit (4) for processing the data, wherein the first interface (2) is a system which has bus capability and to which one or more terminals (5) can be connected, wherein the second interface (3) is an interface for the ISDN telephone network (6) or for the cable television network or for satellite transmission, and wherein the translation unit (4) consists of a plurality of programmable processors (4.1, 4.2, 4.3) which are connected and programmed such that the conversion unit (4) is able to detect a data request via the second interface (3) and is able to send a data inquiry to the system (2) having bus capability in order to forward it to the or to each terminal (5), and is able to read a data response from the or from each terminal (5) via the system (2) having bus capability, to process it and to forward (3) it to the second interface.

2. The apparatus as claimed in claim 1, wherein the data response contains the date, the time of day and an identification for the or for each terminal (5).

3. The apparatus as claimed in claim 1, wherein different terminals (5) can be read at different times.

4. The apparatus as claimed in claim 1, wherein reading can be used to perform a function test on the terminals (5).

* * * * *